United States Patent
Takano et al.

(10) Patent No.: US 11,579,213 B2
(45) Date of Patent: Feb. 14, 2023

(54) MAGNETIC SENSOR

(71) Applicant: TDK Corporation, Tokyo (JP)

(72) Inventors: Kenichi Takano, Tokyo (JP); Yuta Saito, Tokyo (JP); Hiraku Hirabayashi, Tokyo (JP)

(73) Assignee: TDK Corporation, Tokyo (JP)

(*) Notice: Subject to any disclaimer, the term of this patent is extended or adjusted under 35 U.S.C. 154(b) by 51 days.

(21) Appl. No.: 17/205,222

(22) Filed: Mar. 18, 2021

(65) Prior Publication Data
US 2021/0208215 A1  Jul. 8, 2021

Related U.S. Application Data

(63) Continuation-in-part of application No. 16/407,234, filed on May 9, 2019, now Pat. No. 10,983,181.

(30) Foreign Application Priority Data

Oct. 24, 2018  (JP) .............................. JP2018-199998

(51) Int. Cl.
*G01R 33/09* (2006.01)
*G11B 5/31* (2006.01)
*G11B 5/39* (2006.01)

(52) U.S. Cl.
CPC ............ *G01R 33/09* (2013.01); *G11B 5/3146* (2013.01); *G11B 5/3932* (2013.01)

(58) Field of Classification Search
CPC .......... G01R 33/093; G01R 33/09–098; G01R 15/205; H01L 43/10; H01L 43/08;
(Continued)

(56) References Cited

U.S. PATENT DOCUMENTS 8,066,897 B2  11/2011  Marley
2003/0030949 A1  2/2003  Ghaly et al.
(Continued)

FOREIGN PATENT DOCUMENTS

JP  H07-509811 A  10/1995
JP  2006-128234 A  5/2006
(Continued)

OTHER PUBLICATIONS

Sharma et al., "Effect of Seedlayer and Junction Geometry on Permanent Magnets Stabilisation of Magnetoresistive Heads", IEEE, 2000 (Year: 2000).
(Continued)

*Primary Examiner* — Selim U Ahmed
*Assistant Examiner* — Evan G Clinton
(74) *Attorney, Agent, or Firm* — Posz Law Group, PLC

(57) ABSTRACT

A magnetic sensor whose output characteristic is less sensitive to the environmental temperature is provided. Magnetic sensor 1 has free layer 24 whose magnetization direction changes in response to an external magnetic field, pinned layer 22 whose magnetization direction is fixed with respect to the external magnetic field, spacer layer 23 that is located between pinned layer 22 and free layer 24 and that exhibits a magnetoresistance effect, and at least one magnet film 25 that applies a bias magnetic field to free layer 24. The film thickness of the magnet film is 15 nm or more and 50 nm or less. The relationship of $0.7 \leq T_{C\_HM}/T_{C\_FL} \leq 1.05$ is satisfied, where $T_{C\_HM}$ is Curie temperature of the magnet film, and $T_{C\_FL}$ is Curie temperature of the free layer.

37 Claims, 8 Drawing Sheets

(58) Field of Classification Search
CPC ............. H01F 10/3295; H01F 10/3272; G11C 11/161; G11B 5/39–3993; G11B 2005/3996; H03B 15/006
See application file for complete search history.

(56) References Cited

U.S. PATENT DOCUMENTS

| | | |
|---|---|---|
| 2006/0176622 A1 | 8/2006 | Pinarbasi |
| 2009/0166331 A1 | 7/2009 | Marley |
| 2019/0088276 A1* | 3/2019 | Ong ..................... G11B 5/3146 |

FOREIGN PATENT DOCUMENTS

| | | |
|---|---|---|
| WO | 2014/162730 A1 | 10/2014 |
| WO | 2014/208105 A1 | 12/2014 |
| WO | 2017/151058 A1 | 9/2017 |

OTHER PUBLICATIONS

Darling et al., Cobalt-Platinum Alloys a Critical Review of the Constitution and Properties, Platinum Metal Review., 1963 (Year:1963).

Charilaou et al., "Magnetic Properties of Ultrathin Discontinuous Co/Pt Multi layers: Comparison with Short-Range Ordered and Isotropic CoPt3 Flims", Physical Review, 2016 (Year: 2016).

Doerner et al., "Composition Effects in High Density CoPtCr Media", IEEE Transactions on Magnetics, vol. 29, No. 6, Nov. 1993 (Year: 1993).

Cullity et al., "Data on Ferromagnetic Elements", Introduction to Magnetic Materials, 2nd Ed., IEEE, 2009 (Year: 2009).

Zhu et al., "SN R IMpact of Noise by Different Origins in FePt-L 10 HAMR Media", IEEE Transactions on Magnetics, vol. 51, No. 4, Apr. 2015 (Year: 2015).

Plotnikova et al., "Influence of the Structure Defects on the Magnetic Properties of the Fe Pt/Fe Bilayer", Journal of Applied Physics, 115, 2014 (Year: 2014).

Permanet Magnets Limited, "Soft Magnetic Alloys and their Properties", avilable on Internet Archive on Jul. 2, 2016 (Year: 2016).

Jin et al., "Tuning Magnetic Properties for Domain Wall Pinning via Localized Metal Diffusion", Nature Scientific Reports, Nov. 24, 2017 (Year: 2017).

Papusoi et al. "The Effect of Film Thickness of Curie Temperature Distribution and Magnetization Reversal Mechanism for Granular L10 FePt Films", Jun. 28, 2017, J. Phys. D: Appl. Phys. 50 (Year: 2017).

Nirupama Sharma et al., Effect of Seedlayer and Junction Geometry on Permanent Magnet Stabilization of Magnetoresistive Heads, IEEE Transactions on Magnetics, Sep. 2000, p. 2496, vol. 36, No. 5, IEEE Magnetics Society.

H. Danan et al., New Determinations of the Saturation Magnetization of Nickel and Iron, Journal of Applied Physics, 39: 2, p. 669, 1968, The American Institute of Physics.

M. Charilaou et al., Magnetic properties of ultrathin discontinuous Co/Pt multilayers: Comparison with short-range ordered and isotropic CoPt3 films, Physical Review B, 93: 224408, 2016, American Physical Society.

A.S. Darling, Cobalt-Platinum Alloys, A Critical Review of Their Constitution and Properties, Platinum Metals Rev., 1963, 7:3, p. 96, Johnson Matthey Plc.

Ma, Stephanie, "Curie Temperature of Nickle", The Physics Factbook, 2005, https://hypertextbook.com/facts/2005/stephaniema.shtml.

"Ferromagnetic Curie Temperatures", last accessed on Aug. 30, 2021, hyperphysics.phy-astr.gsu.edu/hbase/Tables/Curie.html.

Yu et al., "Curie temperatures of fcc and bcc nickel and permalloy: Supercell and Green's function methods", The American Physical Society, Physical Review B 77, Feb. 25, 2008, 9 pages.

\* cited by examiner

MAGNETIC SENSOR

CROSS REFERENCE TO RELATED APPLICATIONS

The present application is a continuation-in-part of U.S. application Ser. No. 16/407,234, filed May 9, 2019, which is based on, and claims priority from, JP Application No. 2018-199998, filed on Oct. 24, 2018, the disclosures of which is hereby incorporated by reference herein in its entirety.

BACKGROUND OF THE INVENTION

Field of the Invention

The present invention relates to a magnetic sensor, and particularly to a magnetic sensor using a magnetoresistance effect element.

Description of the Related Art

A magnetic sensor that includes a magnetoresistance effect element detects an external magnetic field based on a resistance change that is caused by a magnetoresistance effect. The magnetic sensor that uses a magnetoresistance effect element has a higher output and a higher sensitivity to a magnetic field than other magnetic sensors, and it is also easy to reduce in size. A magnetic sensor generally has a multilayer film structure in which a free layer, whose magnetization direction changes in response to an external magnetic field, a spacer layer, that exhibits a magnetoresistance effect, and a pinned layer whose magnetization direction is fixed with respect to the external magnetic field are stacked in this order. US2003/0030949 discloses a magnetic sensor having a magnet film that is provided on the lateral side of a free layer. WO2014/208105 discloses a magnetic sensor having a conductor film that applies a lateral bias magnetic field to the surface of a magnet film.

A magnet film that is provided on the lateral side of a free layer makes the magnetization direction of the free layer uniform. However, in addition to the output characteristic of the magnetic sensor, the magnetic characteristic of the magnet film is also influenced by the environmental temperature.

The present invention aims at providing a magnetic sensor whose output characteristic is less sensitive to the environmental temperature due to the controlled magnetic characteristics of the magnet film that is provided on the lateral side of a free layer.

SUMMARY OF THE INVENTION

A magnetic sensor of the present invention comprises: a free layer whose magnetization direction changes in response to an external magnetic field; a pinned layer whose magnetization direction is fixed with respect to the external magnetic field; a spacer layer that is located between the pinned layer and the free layer and that exhibits a magnetoresistance effect; and at least one magnet film that applies a bias magnetic field to the free layer. The film thickness of the magnet film is 15 nm or more and 50 nm or less. The relationship of $0.7 \leq T_{C\_HM}/T_{C\_FL} \leq 1.05$ is satisfied, where $T_{C\_HM}$ (K) is a Curie temperature of the magnet film, and $T_{C\_FL}$ (K) is a Curie temperature of the free layer.

According to the present invention, a magnetic sensor whose output characteristic is less sensitive to the environmental temperature can be provided.

The above and other objects, features and advantages of the present invention will become apparent from the following description with reference to the accompanying drawings which illustrate examples of the present invention.

DETAILED DESCRIPTION OF THE PREFERRED EMBODIMENT

Hereinafter, a magnetic sensor according to an embodiment of the present invention will be described with reference to the drawings. In the following explanation and drawings, X-direction is the magnetically sensitive direction of the magnetic sensor, and also corresponds both to the magnetization direction of the pinned layer and to the short axis direction of the magnetoresistance effect element. Y-direction is the direction orthogonal to the magnetically sensitive direction (X-direction) of the magnetic sensor, and also corresponds both to the magnetization direction of the free layer in the zero magnetic field state and to the long axis direction of the magnetoresistance effect element. In the present specification, the "zero magnetic field" means a state where a magnetic field other than a bias magnetic field is not present. Z-direction is a direction orthogonal both to the X-direction and to the Y-direction, and also corresponds to the stacking direction of the multilayer film of the magnetoresistance effect element. It should be noted that the direction of the arrow showing the X-direction in each drawing may be referred to as a +X-direction and that a direction opposite to the direction of the arrow may be referred to as −X-direction.

Figure 1:
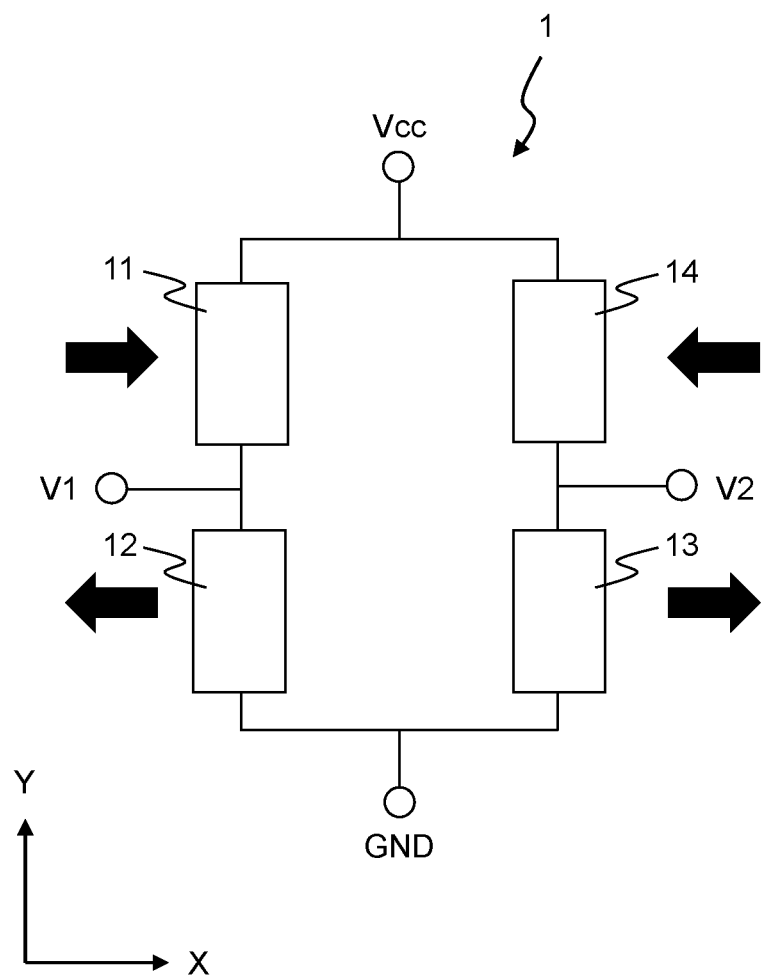
FIG. 1 is a circuit diagram schematically illustrating the configuration of a magnetic sensor.

FIG. 1 illustrates a schematic circuit configuration of the magnetic sensor. Magnetic sensor 1 has four magnetoresistance effect elements (hereinafter, referred to as first magnetoresistance effect element 11, second magnetoresistance effect element 12, third magnetoresistance effect element 13 and fourth magnetoresistance effect element 14), and magnetoresistance effect elements 11 to 14 are connected to each other by a bridge circuit (the Wheatstone bridge). Four magnetoresistance effect elements 11 to 14 are divided into two sets, that is, a set of magnetoresistance effect elements 11, 12 and a set of magnetoresistance effect elements 13, 14, and magnetoresistance effect elements 11, 12 and magnetoresistance effect elements 13, 14 are connected in series, respectively. One end of the set of magnetoresistance effect element set 11, 12 and one end of the set of magnetoresistance effect element set 13, 14 are connected to power supply voltage Vcc, and the other ends are connected to the ground (GND). Midpoint voltage V1 between first magnetoresistance effect element 11 and second magnetoresistance effect element 12, and midpoint voltage V2 between third magnetoresistance effect element 13 and fourth magnetoresistance effect element 14 can be taken out. Accordingly, mid-point voltages V1, V2 can be obtained by the following equations, respectively, where electric resistances of first to fourth magnetoresistance effect elements 11 to 14 are R1 to R4, respectively.

$$V_1 = \frac{R_2}{R_1 + R_2} V_{cc} \quad \text{(Equation 1)}$$

$$V_2 = \frac{R_3}{R_3 + R_4} V_{cc} \quad \text{(Equation 2)}$$

Figure 2A:
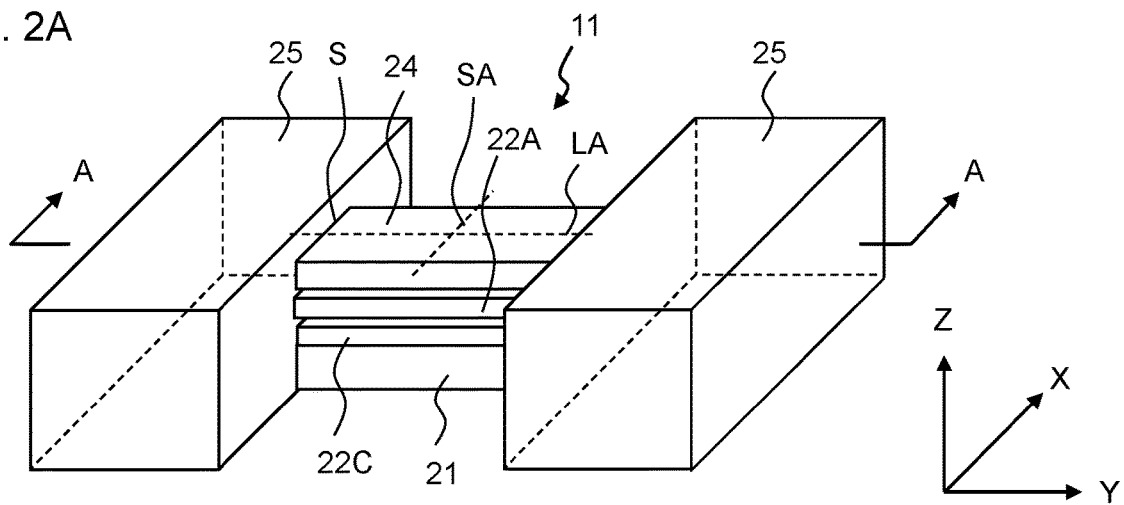
FIGS. 2A-2B are views schematically illustrating a configuration of a magnetoresistance effect element.
Figure 2B:
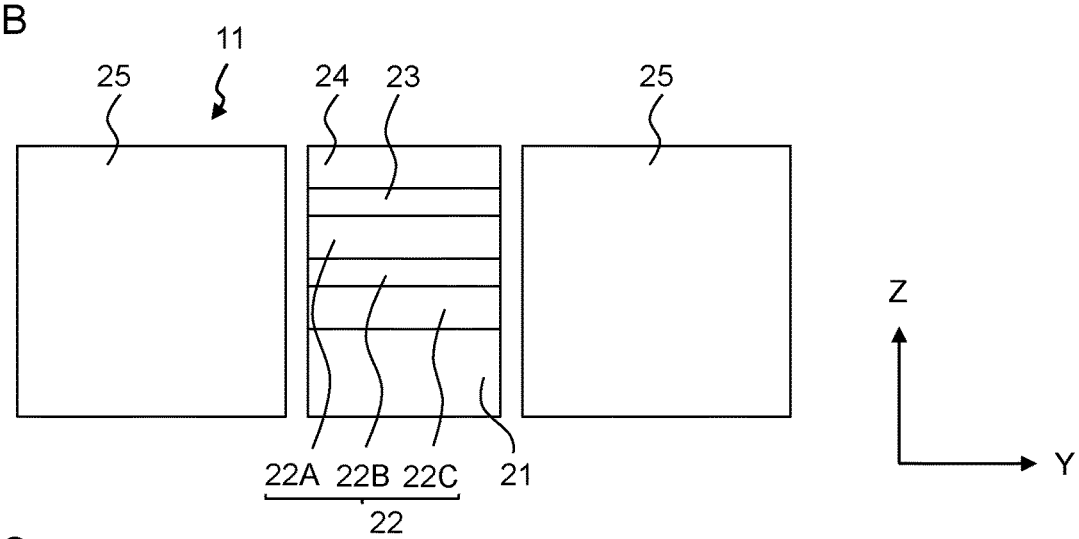

FIGS. 2A and 2B are conceptual views schematically illustrating the configuration of first to fourth magnetoresistance effect elements 11 to 14. Since first to fourth magnetoresistance effect elements 11 to 14 have the same configuration, first magnetoresistance effect element 11 will be described here. FIG. 2A is a schematic perspective view of first magnetoresistance effect element 11, and FIG. 2B is a sectional view taken along line A-A in FIG. 2A. First magnetoresistance effect element 11 has a typical spin valve type film configuration. First magnetoresistance effect element 11 is formed of stacked layers that include antiferromagnetic layer 21, pinned layer 22, spacer layer 23 and free layer 24, which are stacked in this order. Pinned layer 22 is composed of inner pinned layer 22A, nonmagnetic intermediate layer 22B and outer pinned layer 22C, wherein inner pinned layer 22A is in contact with spacer layer 23, and outer pinned layer 22C is in contact with antiferromagnetic layer 21. The stacked layers are sandwiched by a pair of electrode layers (not illustrated) in the Z-direction in order to allow a sense current to flow in the Z-direction from the electrode layer to the stacked layers.

Free layer 24 is a magnetic layer whose magnetization direction changes in response to an external magnetic field and may be formed, for example, of NiFe. Outer pinned layer 22C is a ferromagnetic layer whose magnetization direction is fixed with respect to the external magnetic field due to an exchange coupling with antiferromagnetic layer 21. Antiferromagnetic layer 21 may be formed of PtMn, IrMn, NiMn and the like. Inner pinned layer 22A is a ferromagnetic layer that is sandwiched between outer pinned layer 22C and spacer layer 23 and is magnetically, or more specifically, antiferromagnetically, coupled with outer pinned layer 22C via nonmagnetic intermediate layer 22B that is formed of Ru, Rh and the like. Accordingly, the magnetization directions of both inner pinned layer 22A and outer pinned layer 22C are fixed with respect to the external magnetic field, but the magnetization directions are antiparallel to each other. Spacer layer 23 is a nonmagnetic layer that is located between free layer 24 and inner pinned layer 22A and that exhibits a magnetoresistance effect. Spacer layer 23 may be a nonmagnetic conductive layer that is formed of a nonmagnetic metal, such as Cu, or may be a tunnel barrier layer that is formed of a nonmagnetic insulator, such as $Al_2O_3$. When spacer layer 23 is a nonmagnetic conductive layer, first magnetoresistance effect element 11 functions as a giant magnetoresistance effect (GMR) element, and when spacer layer 23 is a tunnel barrier layer, first magnetoresistance effect element 11 functions as a tunnel magnetoresistance effect (TMR) element. First magnetoresistance effect element 11 is more preferably a TMR element because of a higher MR change rate and because of a higher output voltage of the bridge circuit. In the present embodiment, first magnetoresistance effect element 11 is a TMR element.

Pinned layer 22 may be formed as a single layer by omitting inner pinned layer 22A (or outer pinned layer 22C) and nonmagnetic intermediate layer 22B. However, pinned layer 22 that is made of a synthetic structure composed of inner pinned layer 22A, nonmagnetic intermediate layer 22B and outer pinned layer 22C can make the magnetization direction of inner pinned layer 22A more stable than pinned layer 22 that is made of a single layer structure. Further, the magnetic field that leaks to the outside can be limited because the magnetic field that is released from inner pinned layer 22A is cancelled by the magnetic field that is released from outer pinned layer 22C. For these reasons, pinned layer 22 is preferably made of a synthetic structure.

At least one magnet film 25 is provided on the lateral side of first magnetoresistance effect element 11 in the Y-direction. In the present embodiment, a pair of magnet films 25 is provided on both lateral sides of first magnetoresistance effect element 11 in the Y-direction. Magnet films 25 are located on the lateral sides of free layer 24 and pinned layer 22 in the Y-direction, but may be located at least on the lateral side of free layer 24 in the Y-direction. Insulating films (not illustrated) that prevent the occurrence of a short circuit between free layer 24 and pinned layer 22 are provided between free layer 24 and magnet films 25 and between pinned layer 22 and magnet films 25. Magnet films 25 apply a bias magnetic field to free layer 24 in the Y-direction, aligning the magnetization direction of free layer 24 in the Y-direction in the zero magnetic field state. Magnet films 25 are mainly formed of CoPt, FePt or SmCo, and may further contain at least one element selected from the group consisting of Cr, Ta, B, Ni, Ti, W, V, Mo, Mn, Zr, Nb, Hf, Si, Cu, Ag, Al, Ru and Rh. Here, the term "mainly" means that the total atomic fraction of the element is 70% or more.

As illustrated in FIG. 2A, first magnetoresistance effect element 11 has a substantially rectangular shape having long axis LA and short axis SA, as well as short sides S that face a pair of magnet films 25, as seen in the Z-direction. Accordingly, free layer 24, inner pinned layer 22A and outer pinned layer 22C has each a substantially rectangular shape having short sides S that face the pair of magnet films 25.

Figure 2C:
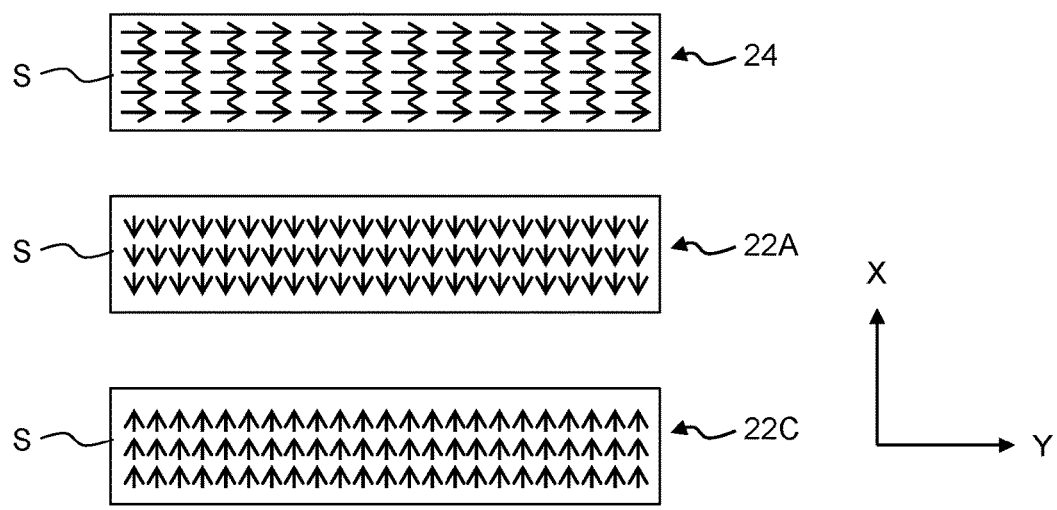
FIG. 2C is a view schematically illustrating magnetization of a free layer, an inner pinned layer and an outer pinned layer in a zero magnetic field state.

FIG. 2C conceptually illustrates magnetization of free layer 24, inner pinned layer 22A and outer pinned layer 22C in the zero magnetic field state. The arrows in the drawing schematically show the magnetization direction of each layer. Free layer 24 is magnetized substantially in the long axis LA direction (Y-direction) in the zero magnetic field state due to the bias magnetic field from magnet films 25. Inner pinned layer 22A and outer pinned layer 22C are magnetized in a substantially short axis SA direction (X-direction), and the magnetization directions are antiparallel to each other, as described above. When an external magnetic field is applied in the X-direction, that is, in the magnetically sensitive direction, the magnetization direction of free layer 24 rotates clockwise or counterclockwise in FIG. 2C in accordance with the direction and the 25 strength of the external magnetic field. Thus, a relative angle between the magnetization direction of inner pinned layer 22A and the magnetization direction of free layer 24 changes, and accordingly, electric resistance to the sense current changes. Inner pinned layer 22A may also be called a reference layer because it provides a reference of rotation angle of the magnetization direction for free layer 24.

Figure 3A:
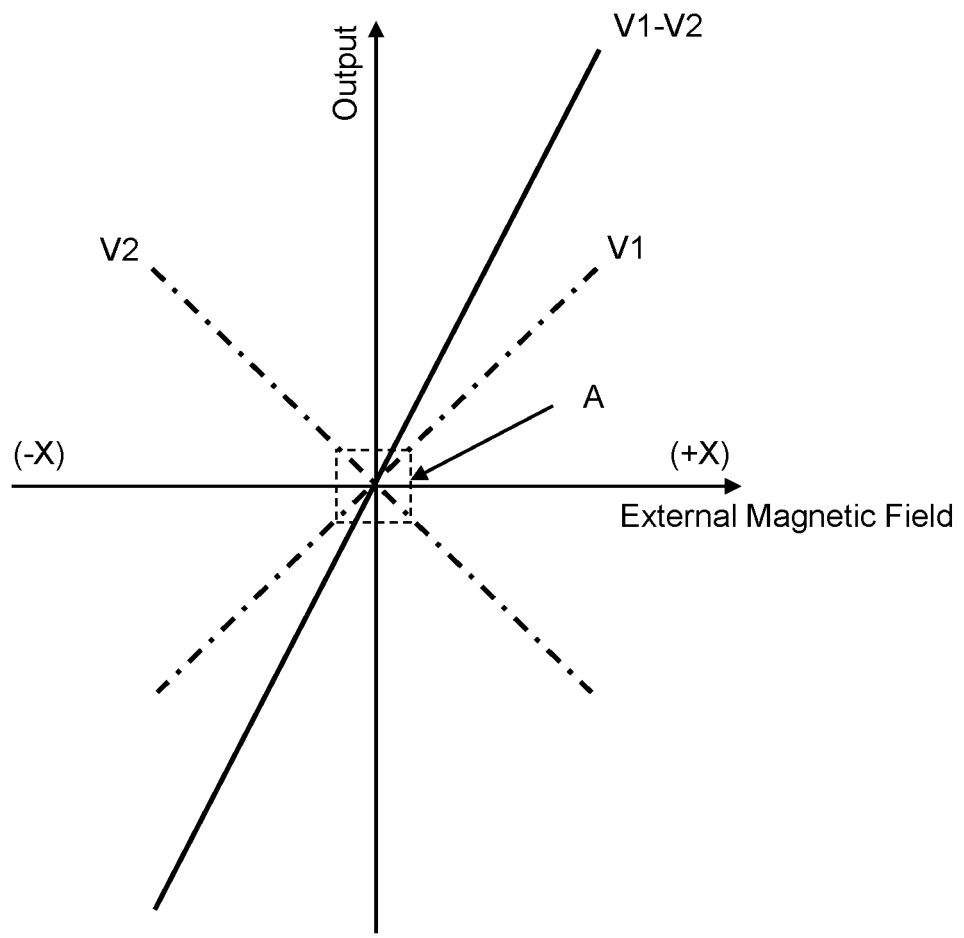
FIGS. 3A-3B are conceptual diagrams explaining an output and an offset of a magnetic sensor.

Referring again to FIG. 1, the magnetization of inner pinned layers 22A of first to fourth magnetoresistance effect elements 11 to 14 are directed in the direction of the arrows in the drawing. Accordingly, when an external magnetic field is applied in the +X direction, electric resistances of first and third magnetoresistance effect elements 11, 13 decrease, while electric resistances of second and fourth magnetoresistance effect elements 12, 14 increase. Thus, as illustrated in FIG. 3A, midpoint voltage V1 increases, and midpoint voltage V2 decreases. When an external magnetic field is applied in the −X direction, midpoint voltage V1 decreases and midpoint voltage V2 increases, contrary to the above. By detecting difference V1-V2 of midpoint voltages V1, V2, the sensitivity can be doubled as compared to detecting midpoint voltages V1, V2 separately. Further, when midpoint voltages V1, V2 are offset (that is, midpoint voltages V1, V2 are shifted along the output axis in FIG. 3A), the influence of the offset can be eliminated by detecting the difference.

Figure 3B:
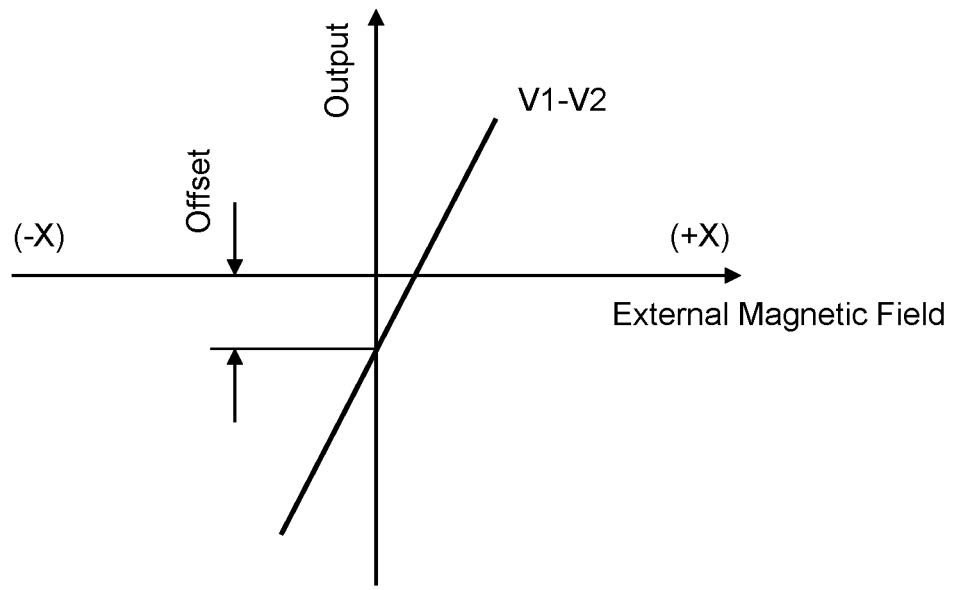

However, due to the variation of first to fourth magnetoresistance effect elements 11 to 14, equations 1 and 2 do not strictly apply and some errors occur. Therefore, as illustrated in FIG. 3B, which is an enlarged view of part A in FIG. 3A, an offset occurs in difference V1-V2. The offset is a deviation of difference V1-V2 from zero in the zero magnetic field state. The offset influences the accuracy with which an external magnetic field is measured.

The magnitude of the offset changes depending on the environmental temperature of the magnetoresistance effect element. For example, in the case of a TMR element, electric resistance decreases when the temperature is high. Further, in the case of a TMR element, output decreases because the MR change rate decreases when the temperature is high. These temperature characteristics influence the magnitude of the offset. Further, since magnetic sensor 1 is used in a wide temperature range of approximately −50 to 150° C., the offset tends to variate in a wider range. However, it is difficult to control the environmental temperature, and it is therefore desirable that the offset be essentially less sensitive to the environmental temperature.

Further, in magnetic sensor 1 including magnet film 25, temperature dependency of the offset depends on the Curie temperature (a temperature at which the ferromagnetic property is lost) of magnet film 25. In order to cope with this problem, magnetic sensor 1 of the present embodiment satisfies the relationship of $0.7 \leq T_{C\_HM}/T_{C\_FL} \leq 1.05$, more preferably, $0.7 \leq T_{C\_FL} \leq 0.9$, where $T_{C\_HM}$ is the Curie temperature of magnet film 25, and $T_{C\_FL}$ is the Curie temperature of free layer 24. Hereinafter, an example will be described.

Figure 7A:
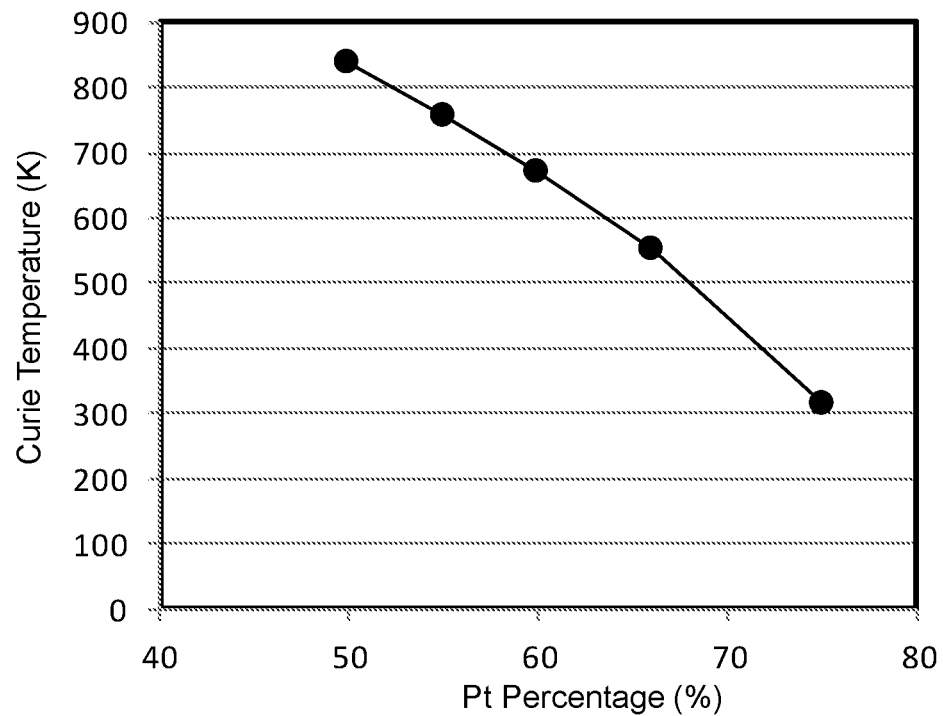
FIGS. 7A-7B are graphs explaining parameters that influence the Curie temperature.

A plurality of magnetic sensors 1 having the block circuit illustrated in FIG. 1 and the film configuration illustrated in FIGS. 2A and 2B were manufactured. Each of first to fourth magnetoresistance effect elements 11 to 14 was formed into a rectangular shape with long axis LA of 3.5 μm and short axis SA of 0.5 μm, as seen from the Z-direction. Free layer 24 was formed of a CoFe layer (film thickness of 2 nm)/a NiFe layer (film thickness of 6 nm), inner pinned layer 22A was formed of a CoFe layer (film thickness of 1.8 nm), outer pinned layer 22C was formed of a CoFe layer (film thickness of 1.7 nm), antiferromagnetic layer 21 was formed of an IrMn layer (film thickness of 10 nm), and magnet films 25 were formed of CoPt layers (film thickness of 35 nm or 50 nm). The CoFe layer/NiFe layer of free layer 24 means that the CoFe layer is deposited first, that is, the CoFe layer is in contact with spacer layer 23. Spacer layer 23 was formed of MgO, and nonmagnetic intermediate layer 22B was formed of Ru. The Curie temperature of magnet films 25 was changed in a range of 450K to 900K, and a change in the offset in relation to a change in the environmental temperature was measured. The Curie temperature was adjusted by changing an atomic fraction of Pt, as illustrated in FIG. 7A.

Figure 4A:
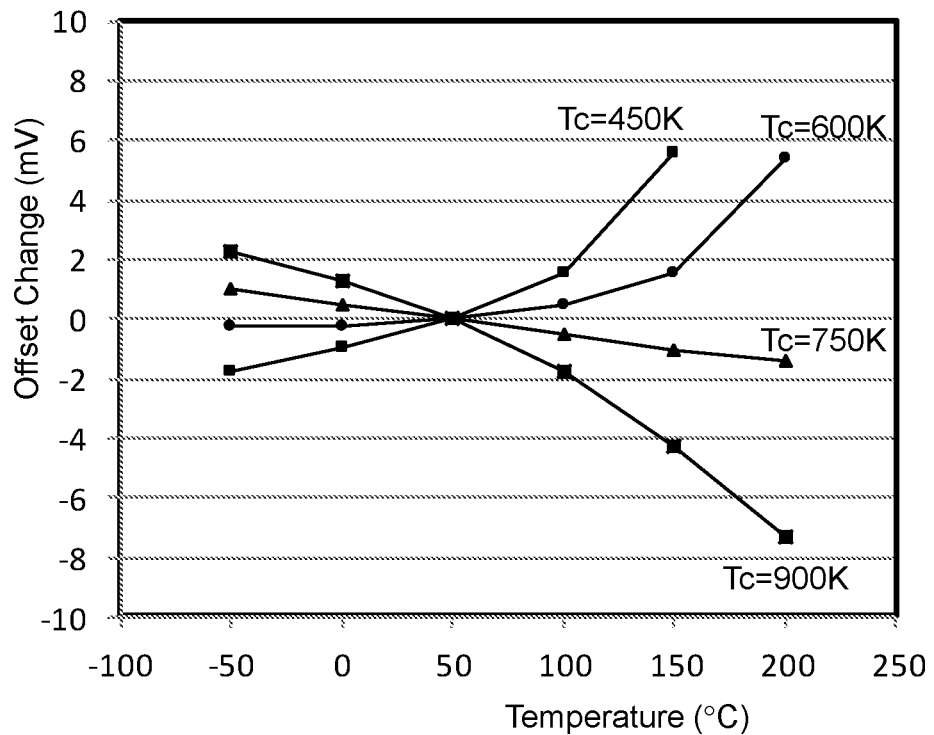
FIGS. 4A-4B are graphs showing measurements of an offset change versus the environmental temperature.
Figure 4B:
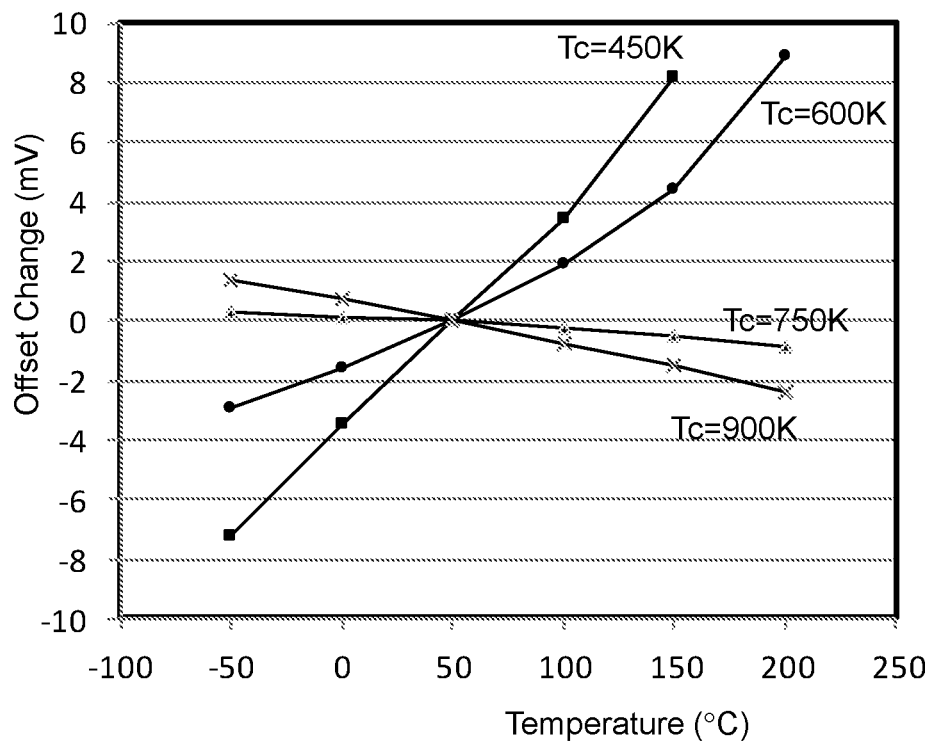

FIG. 4A shows a measurement of the offset change for magnet films 25 having a film thickness of 35 nm, and FIG. 4B shows a measurement of the offset change for magnet films 25 having a film thickness of 50 nm. The vertical axis shows the offset change. The offset change is normalized by the offset at 50° C. That is, the offset change is a deviation from the offset at 50° C. Referring to FIGS. 4A and 4B, the offset change monotonously increases relative to the environmental temperature when the Curie temperature of magnet films 25 is low, and the offset change monotonously decreases relative to the environmental temperature when the Curie temperature is high. The offset change relative to the environmental temperature is minimized at $T_C$=750K. The offset shows a significant change when the environmental temperature exceeds 150° C. This is because antiferromagnetic layer 21 has a low blocking temperature and thereby the coupling magnetic field between antiferromagnetic layer 21 and outer pinned layer 22C is reduced when the environmental temperature exceeds 150° C.

The reason why we think that the offset change varies depending on the Curie temperature of magnet films 25 is as follows. In general, the sensitivity of magnetic sensor 1 having a TMR element is reduced when the environmental temperature rises. On the other hand, the bias magnetic field from magnet films 25 changes depending on the relationship between the Curie temperature and the environmental temperature. When the Curie temperature is low, the bias magnetic field of magnet films 25 tends to decrease as the environmental temperature rises. This weakens the force that binds the magnetization direction of free layer 24 (that is, the magnetization direction of free layer 24 easily rotates), and thereby increases the sensitivity. This is a factor that increases the offset change relative to the environmental temperature. When the Curie temperature is high, the decrease of the bias magnetic field is small in this temperature range. Thus, the sensitivity of free layer 24 decreases as the temperature rises. This is the reason why the trending of FIGS. 4A and 4B is obtained. Further, when these factors are balanced, the offset change is minimized.

Figure 5:
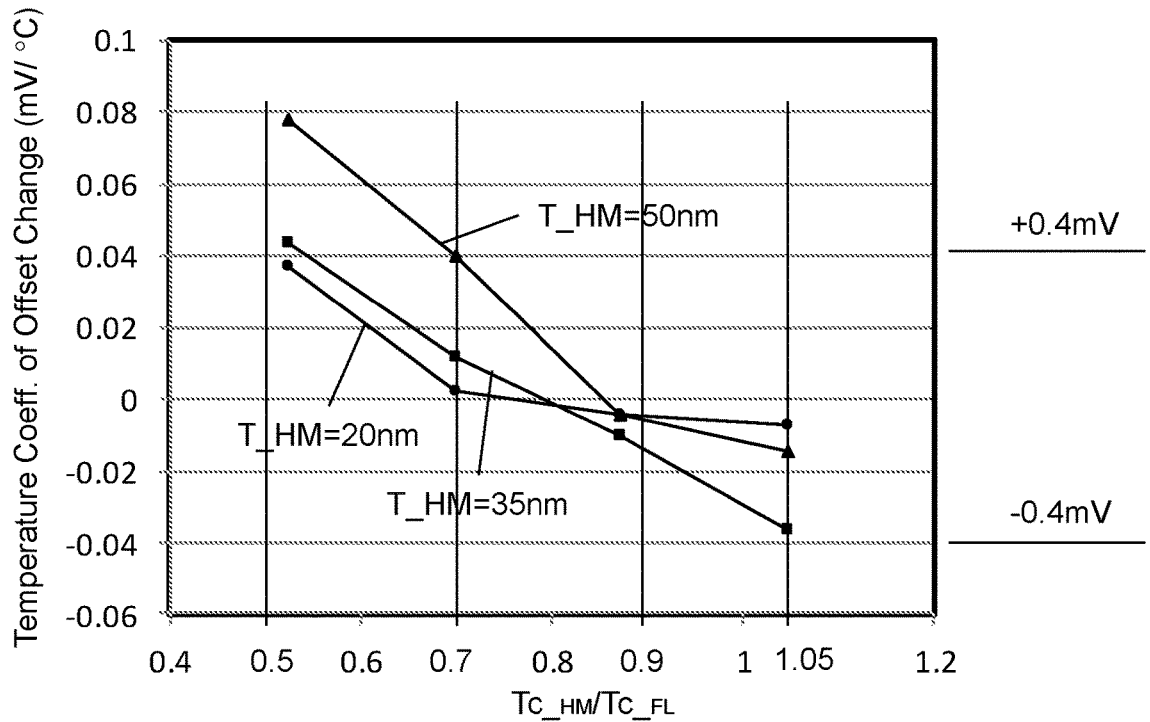
FIG. 5 is a graph showing a relationship between $T_{C\_HM}/T_{C\_FL}$ and the offset change.

For magnetic sensor 1 that uses a magnetoresistance effect element having magnet films 25, the maximum output voltage is about 400 mV. If the offset change due to temperature is limited within 1% at largest, then the influence of the offset is, in actual practice, not a large problem. Accordingly, it is desirable that the offset change be limited within about ±4 mV. As described above, the offset change monotonously increases or monotonously decreases. Thus, a target value of an offset change per unit temperature is set at about 0.04 mV/° C. A range of $T_{C\_HM}/T_{C\_FL}$ (ratio of Curie temperature $T_{C\_HM}$ of magnet films 25 to Curie temperature $T_{C\_FL}$ of free layer 24) where the offset change is within about 0.04 mV/° C. was obtained in the environmental temperature range of −50 to 150° C. The result is shown in FIG. 5. The result for magnet films 25 having a film thickness of 20 nm is also shown in FIG. 5. When the film thickness of magnet films 25 is 20 nm or 35 nm, the offset change falls within the target in the range of $0.5 \leq T_{C\_HM}/T_{C\_FL} \leq 1.05$, and the offset change is minimized in the range of $0.7 \leq T_{C\_HM}/T_{C\_FL} \leq 0.9$. When the film thickness of magnet films 25 is 50 nm, the offset change falls within the target in the range of $0.7 \leq T_{C\_HM}/T_{C\_FL} \leq 1.05$, and the offset change is minimized in the range of $0.8 \leq T_{C\_FL} \leq 1.05$.

Figure 6:
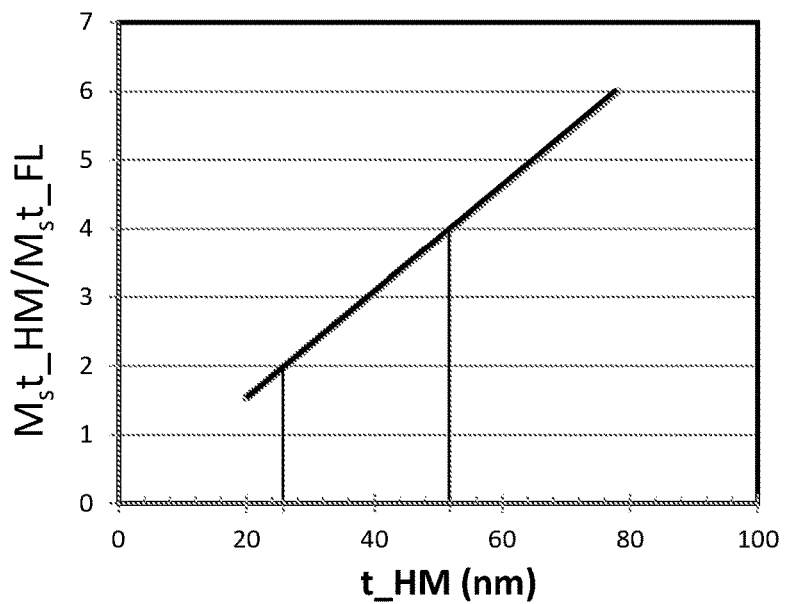
FIG. 6 is a graph showing the relationship between the film thickness of the magnet film and $M_s t_{\_HM}/M_s t_{\_FL}$.

However, when the film thickness of magnet films 25 is large, the output of magnetic head 1 decreases because the bias magnetic field increases and thereby the magnetization direction of free layer 24 is less apt to rotate. On the other hand, magnet films 25 having a small film thickness cannot magnetize free layer 24 into a single magnetic domain. A ratio $M_s t_{\_HM}/M_s t_{\_FL}$ of a magnetic thickness $M_s t_{\_HM}$ of magnet film 25 ($M_s$ is saturated magnetization of magnet film 25, t is the film thickness of magnet film 25) to magnetic thickness $M_s t_{\_FL}$ of free layer 24 ($M_s$ is saturated magnetization of free layer 24, t is the film thickness of free layer 24) is preferably two or more and four or less. The magnetic thickness of free layer 24 of the example is 7.8 A (0.78 emu/cm$^2$). Thus, a preferable magnetic thickness of magnet film 25 is 15.6 to 31.2 A (1.56 to 3.12 emu/cm$^2$), which corresponds to 26 to 52 nm when converted into a film thickness. It should be noted that there is a proportional relationship between film thickness $t_{\_HM}$ of magnet film 25 and $M_s t_{\_HM}/M_s t_{\_FL}$, as shown in FIG. 6.

Accordingly, it is preferable that $T_{C\_HM}/T_{C\_FL}$ satisfy $0.7 \leq T_{C\_HM}/T_{C\_FL} \leq 1.05$, when taking a preferable film thickness of magnet 25 into consideration. It should be noted that the above-mentioned film thickness of 26 to 52 nm is a mere example because a preferable film thickness of magnet film 25 depends on the magnetic thickness of free layer 24. The lower limit of the film thickness of magnet film 25 is preferably at least 15 nm or more, and the thickness of magnet film 25 may be appropriately set, for example, to be 20 nm or 25 nm, depending on the magnetic thickness of free layer 24. Similarly, the upper limit of the film thickness of magnet film 25 may be selected, for example, from among 50 nm, 60 nm and 70 nm, depending on the magnetic thickness of free layer 24.

Figure 7B:
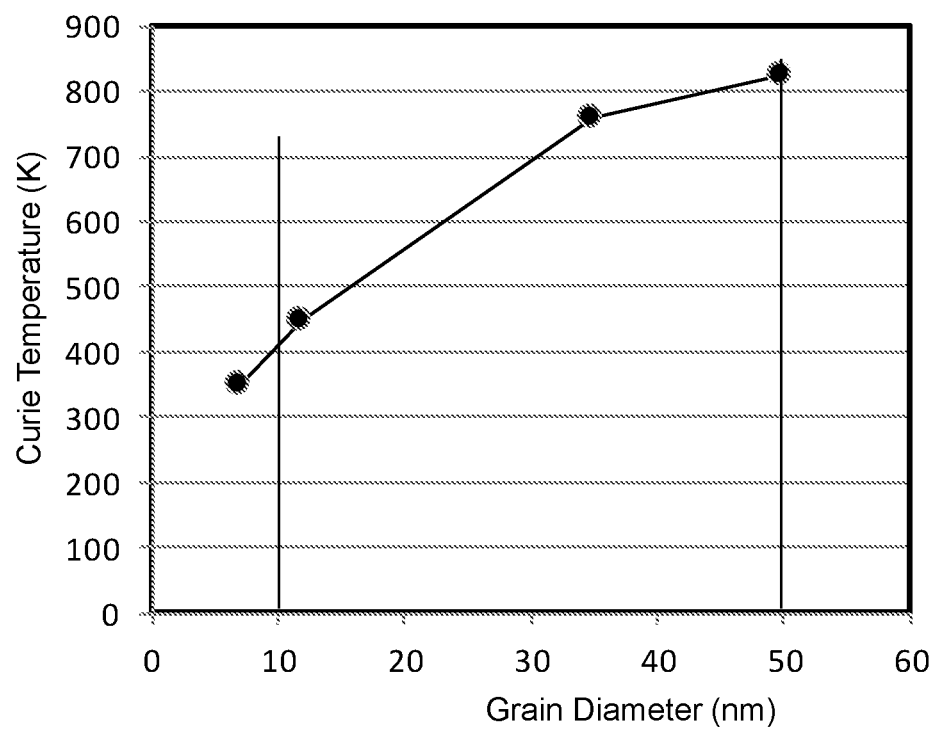

Curie temperature $T_{C\_HM}$ of magnet film 25 can be easily adjusted by changing the composition thereof, as described above with reference to FIG. 7A. Curie temperature $T_{C\_HM}$ of magnet film 25 can also be adjusted by changing the average grain diameter of magnetic grains, as shown in FIG. 7B. In FIG. 7B, the horizontal axis represents the average grain diameter of magnetic grains that form magnet film 25, as seen in the Z-direction, and the vertical axis represents the Curie temperature. The magnetic film is formed of Co50Pt50, and the Curie temperature varies between 420K and 830K in the range of the average grain diameter of 10 nm or more and 50 nm or less. Since Curie temperature $T_{C\_FL}$ of free layer 24 is normally in a range of 650K to 900K, if the average grain diameter is 10 nm or more and 50 nm or less, the relationship of $0.7 \leq T_{C\_HM}/T_{C\_FL} \leq 1.05$ can be easily satisfied.

Figure 8:
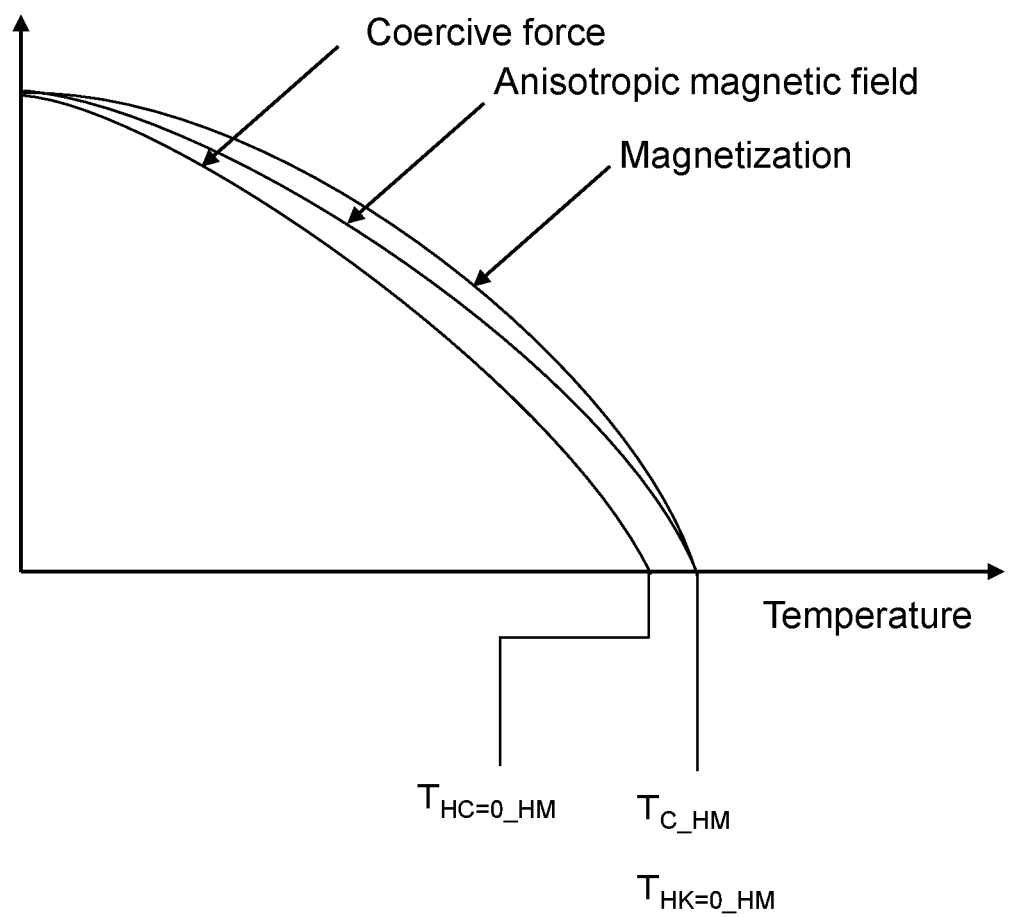
FIG. 8 is a conceptual diagram illustrating the relationship between the Curie temperature of a magnet film, the temperature of the magnet film at which an anisotropic magnetic field thereof becomes zero and the temperature of the magnet film at which a coercive force thereof becomes zero.

Further, conceptually, there is a relationship shown in FIG. 8 among the magnetization, the anisotropic magnetic field and the coercive force of magnet film 25 and the environmental temperature. The magnetization and the anisotropic magnetic field of magnet film 25 decrease substantially along identical paths as the temperature increases, and become zero at about the same temperatures. That is, temperature $T_{HK=0\_HM}$ of magnet film 25 at which the anisotropic magnetic field becomes zero corresponds to Curie temperature $T_{C\_HM}$ of magnet film 25. The coercive force of magnet film 25 also decreases substantially along the same path as the magnetization and the anisotropic magnetic field as the temperature increases, but becomes zero at temperature $T_{HC=0\_HM}$ that is slightly lower than Curie temperature $T_{C\_HM}$ and temperature $T_{HK=0\_HM}$ at which the anisotropic magnetic field becomes zero. However, temperature $T_{HC=0\_HM}$ at which the coercive force becomes zero correlates with $T_{C\_HM}$ and $T_{HK=0\_HM}$. Accordingly, it can be said that there is the relationship of $0.7 \leq T_{HK=0\_HM}/T_{C\_FL} \leq 1.05$ between Curie temperature $T_{C\_FL}$ of free layer 24 and temperature $T_{HK=0\_HM}$ of magnet film 25 at which the anisotropic magnetic field becomes zero and that there is the relationship of $0.7 \leq T_{HC=0\_HM}/T_{C\_FL} \leq 1.05$ between Curie temperature $T_{C\_FL}$ of free layer 24 and temperature $T_{HC=0\_HM}$ of magnet films 25 at which the coercive force becomes zero.

Figure 9A:
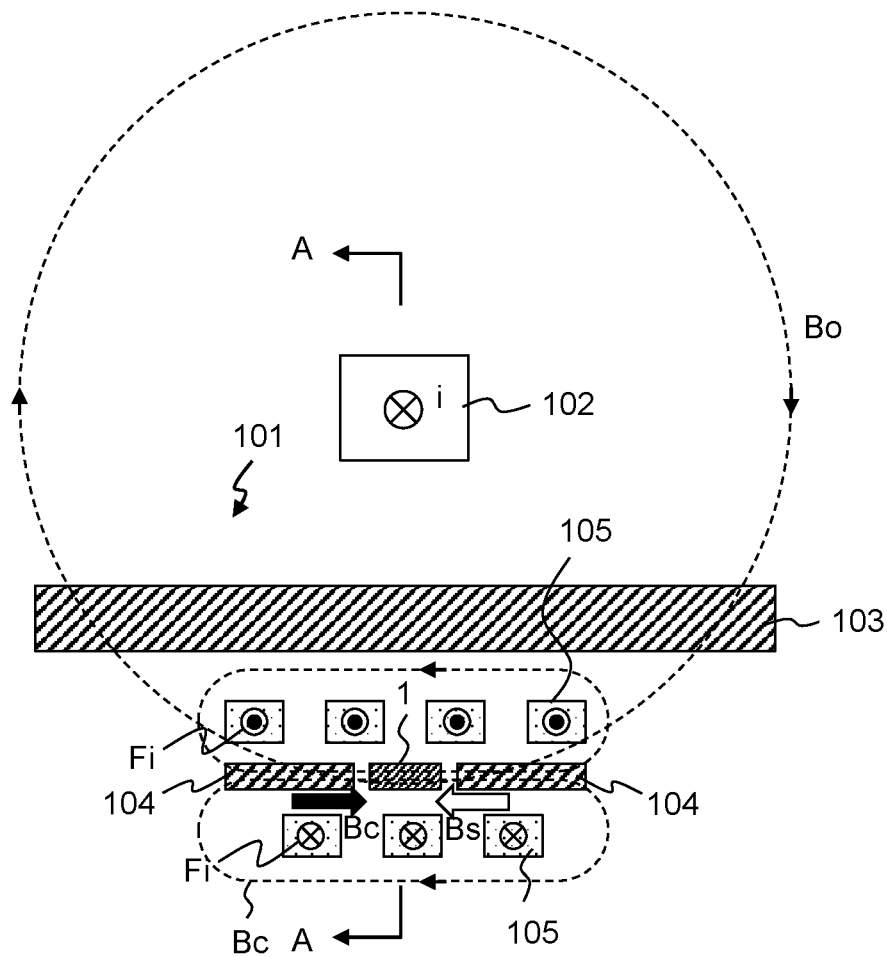
FIGS. 9A-9B are views schematically illustrating a current sensor that uses a magnetic sensor of the present invention.
Figure 9B:
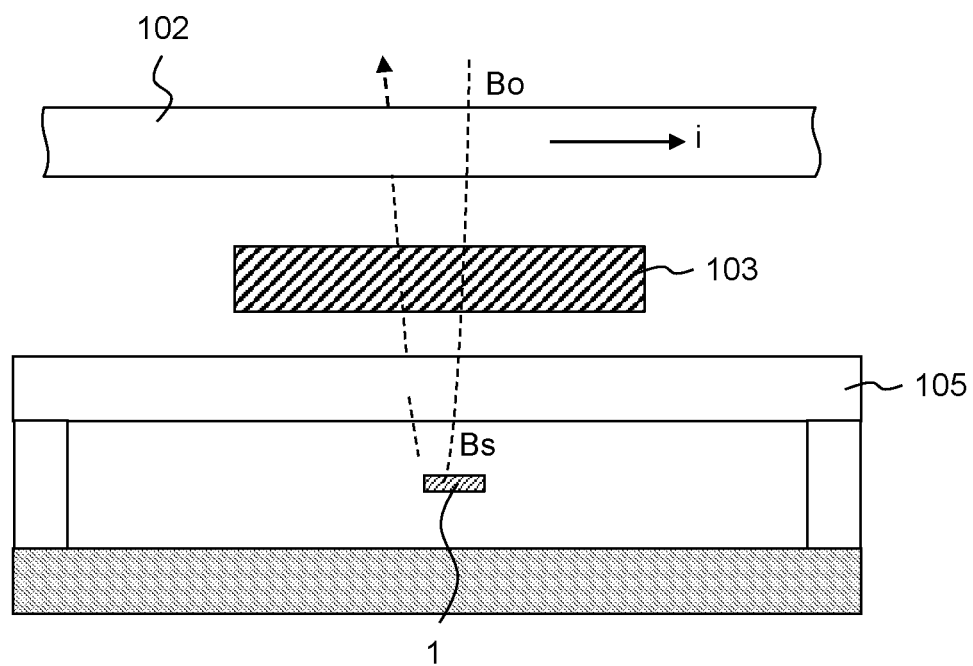

Magnetic sensor 1 described above can be used, for example, in a current sensor. FIG. 9A illustrates a schematic sectional view of current sensor 101 having magnetic sensor 1. FIG. 9B is a sectional view taken along line A-A in FIG. 9A. Magnetic sensor 1 is installed in the vicinity of current line 102 and generates a magnetoresistance change in response to a change in signal magnetic field Bs that is applied. Current sensor 101 has first and second soft magnetic bodies 103, 104, which are means for adjusting magnetic field strength, and solenoid type feedback coil 105 that is provided near magnetic sensor 1. Feedback coil 105 generates cancelling magnetic field Bc that cancels signal magnetic field Bs. Feedback coil 105 spirally winds around magnetic sensor 1 and second soft magnetic body 104. Current i flows in current line 102 in the front-to-back direction in the drawing (y-direction) in FIG. 9A, and from left to right in FIG. 9B. Current i induces clockwise external magnetic field Bo in FIG. 9A. External magnetic field Bo is attenuated by first soft magnetic body 103, is then amplified by second soft magnetic body 104, and is then applied leftward to magnetic sensor 1 as signal magnetic field Bs. Magnetic sensor 1 outputs a voltage signal that corresponds to signal magnetic field Bs, and the voltage signal is inputted to feedback coil 105. Feedback current Fi flows in feedback coil 105, and feedback current Fi generates cancelling magnetic field Bc that cancels signal magnetic field Bs. Signal magnetic field Bs and cancelling magnetic field Bc have the same absolute value and are directed in opposite directions. Therefore, signal magnetic field Bs is cancelled by cancelling magnetic field Bc, and a magnetic field that is applied to magnetic sensor 1 is substantially zero. Feedback current Fi is converted into a voltage by resistance (not illustrated), and is outputted as a voltage. The voltage is proportional to feedback current Fi, cancelling magnetic field Bc and signal magnetic field Bs. Accordingly, a current that flows in current line 102 can be obtained from the voltage.

Although a certain preferred embodiment of the present invention has been shown and described in detail, it should be understood that various changes and modifications may be made without departing from the spirit or scope of the appended claims. For example, the magnetic sensor of the above embodiments has a TMR element having a free layer, but the present invention may be applied to any kind of magnetic sensor as long as the magnetic sensor has a magnetoresistance effect element having a magnetic thin film whose magnetization direction changes in response to an external magnetic field and the electric resistance of the magnetoresistance effect element changes depending on the direction of the magnetic field. The magnetic sensor may include at least one magnet film that is disposed preferably near the magnetic thin film and that applies a bias magnetic field to the metal thin film. The magnetoresistance effect element may be, for example, a CPP-GMR (Current Perpendicular-to-Plane Giant Magnetoresistance) element, a CIP-GMR (Current-in-plane Giant Magnetoresistance) element and an AMR (Anisotropic Magneto Magnetoresistance) element. In a CPP-GMR element and a CIP-GMR element, the magnetic thin film may be a free layer that is constructed in the same manner as a free layer of a TMR element, and in an AMR element, the magnetic thin film may be an alloy thin film that is mainly made of a ferromagnetic material, such as Ni and Fe, and that has anisotropy. The film thickness of the metal thin film is preferably 15 nm or more and 50 nm or less. The relationship of $0.7 \leq T_{C\_HM}/T_{C\_ML} \leq 1.05$ is satisfied, where $T_{C\_HM}$ (K) is a Curie temperature of the magnet film, and $T_{C\_ML}$ (K) is a Curie temperature of the metal thin film, and relationship of $0.7 \leq T_{HK=0\_HM}/T_{C\_ML} \leq 1.05$ satisfied, where $T_{HK=0\_HM}$ (K) is a temperature of the magnet film at which an anisotropic magnetic field thereof becomes zero, and $T_{C\_ML}$ (K) is Curie temperature of the metal thin film, and the relationship of $0.7 \leq T_{HC=0\_HM}/T_{C\_ML} \leq 1.05$ is satisfied, where $T_{HC=0\_HM}$ (K) is a temperature of the magnet film at which a coercive force thereof becomes zero, and $T_{C\_ML}$ (K) is a Curie temperature of the metal thin film.

What is claimed is:

1. A magnetic sensor comprising:
a free layer whose magnetization direction changes in response to an external magnetic field;
a pinned layer whose magnetization direction is fixed with respect to the external magnetic field;
a spacer layer that is located between the pinned layer and the free layer and that exhibits a magnetoresistance effect; and
at least one magnet film that applies a bias magnetic field to the free layer,
wherein a film thickness of the at least one magnet film is 15 nm or more and 50 nm or less, and
wherein a relationship of $0.7 \leq T_{C\_Hm}/T_{C\_FL} \leq 0.9$ is satisfied, where $T_{C\_HM}$ (K) is a Curie temperature of the at least one magnet film, and $T_{C\_FL}$ (K) is a Curie temperature of the free layer.

2. The magnetic sensor according to claim 1, wherein the film thickness of the at least one magnet film is 20 nm or more and 50 nm or less.

3. The magnetic sensor according to claim 1, wherein the film thickness of the at least one magnet film is 25 nm or more and 50 nm or less.

4. The magnetic sensor according to claim 1, wherein the at least one magnet film is a pair of magnet films that are located on both lateral sides of the free layer, and the free layer has a rectangular shape having short sides that face the pair of magnet films, as seen from a direction in which the free layer, the spacer layer and the pinned layer are stacked.

5. The magnetic sensor according to claim 1, wherein a ratio of a product of saturated magnetization and a film thickness of the at least one magnet film to a product of saturated magnetization and a film thickness of the free layer is two or more and four or less.

6. The magnetic sensor according to claim 1, wherein the at least one magnet film further contains one or more elements selected from the group consisting of Cr, Ta, B, Ni, Ti, W, V, Mo, Mn, Zr, Nb, Hf, Si, Cu, Ag, Al, Ru and Rh.

7. A magnetic sensor comprising:
a free layer whose magnetization direction changes in response to an external magnetic field;
a pinned layer whose magnetization direction is fixed with respect to the external magnetic field;
a spacer layer that is located between the pinned layer and the free layer and that exhibits a magnetoresistance effect; and
at least one magnet film that applies a bias magnetic field to the free layer,
wherein the at least one magnet film is mainly formed of SmCo, and
wherein a relationship of $0.7 \leq T_{C\_HM}/T_{C\_FL} \leq 1.05$ is satisfied, where $T_{C\_HM}$ (K) is a Curie temperature of the at least one magnet film, and $T_{C\_FL}$ (K) is a Curie temperature of the free layer.

8. The magnetic sensor according to claim 7, wherein a film thickness of the at least one magnet film is 15 nm or more and 50 nm or less.

9. The magnetic sensor according to claim 7, wherein the at least one magnet film further contains one or more elements selected from the group consisting of Cr, Ta, B, Ni, Ti, W, V, Mo, Mn, Zr, Nb, Hf, Si, Cu, Ag, Al, Ru and Rh.

10. The magnetic sensor according to claim 7, wherein the film thickness of the at least one magnet film is 20 nm or more and 50 nm or less.

11. The magnetic sensor according to claim 7, wherein the film thickness of the at least one magnet film is 25 nm or more and 50 nm or less.

12. The magnetic sensor according to claim 7, wherein the at least one magnet film is a pair of magnet films that are located on both lateral sides of the free layer, and the free layer has a rectangular shape having short sides that face the pair of magnet films, as seen from a direction in which the free layer, the spacer layer and the pinned layer are stacked.

13. The magnetic sensor according to claim 7, wherein a ratio of a product of saturated magnetization and a film thickness of the at least one magnet film to a product of saturated magnetization and a film thickness of the free layer is two or more and four or less.

14. A magnetic sensor comprising:
a free layer whose magnetization direction changes in response to an external magnetic field;
a pinned layer whose magnetization direction is fixed with respect to the external magnetic field;
a spacer layer that is located between the pinned layer and the free layer and that exhibits a magnetoresistance effect; and
at least one magnet film that applies a bias magnetic field to the free layer,
wherein a film thickness of the at least one magnet film is 15 nm or more and 50 nm or less, and
wherein a relationship of $0.7 \leq T_{C\_HM}/T_{C\_FL} \leq 1.05$ is satisfied, where $T_{C\_HM}$ (K) is a Curie temperature of the at least one magnet film, and $T_{C\_FL}$ (K) is a Curie temperature of the free layer,
wherein an average grain diameter of magnetic grains that forms the at least one magnetic film is 10 nm or more and 50 nm or less, as seen from a direction in which the free layer, the spacer layer and the outer pinned layer are stacked.

15. The magnetic sensor according to claim 14, wherein the film thickness of the at least one magnet film is 20 nm or more and 50 nm or less.

16. The magnetic sensor according to claim 14, wherein the film thickness of the at least one magnet film is 25 nm or more and 50 nm or less.

17. The magnetic sensor according to claim 14, wherein the at least one magnet film further contains one or more elements selected from the group consisting of Cr, Ta, B, Ni, Ti, W, V, Mo, Mn, Zr, Nb, Hf, Si, Cu, Ag, Al, Ru and Rh.

18. The magnetic sensor according to claim 14, wherein the at least one magnet film is a pair of magnet films that are located on both lateral sides of the free layer, and the free layer has a rectangular shape having short sides that face the pair of magnet films, as seen from a direction in which the free layer, the spacer layer and the pinned layer are stacked.

19. The magnetic sensor according to claim 14, wherein a ratio of a product of saturated magnetization and a film thickness of the at least one magnet film to a product of saturated magnetization and a film thickness of the free layer is two or more and four or less.

20. A magnetic sensor comprising:
a magnetoresistance effect element having a metal thin film whose magnetization direction changes in response to an external magnetic field; and
at least one magnet film that applies a bias magnetic field to the metal thin film,
wherein a film thickness of the at least one magnet film is 15 nm or more and 50 nm or less, and
wherein a relationship of $0.7 \leq T_{C\_HM}/T_{C\_ML} \leq 1.05$ is satisfied, where $T_{C\_HM}$ (K) is a Curie temperature of the at least one magnet film, and $T_{C\_ML}$ (K) is a Curie temperature of the metal thin film.

21. The magnetic sensor according to claim 20, wherein the film thickness of the at least one magnet film is 20 nm or more and 50 nm or less.

22. The magnetic sensor according to claim 20, wherein the film thickness of the at least one magnet film is 25 nm or more and 50 nm or less.

23. The magnetic sensor according to claim 20, wherein the at least one magnet film further contains one or more elements selected from the group consisting of Cr, Ta, B, Ni, Ti, W, V, Mo, Mn, Zr, Nb, Hf, Si, Cu, Ag, Al, Ru and Rh.

24. The magnetic sensor according to claim 20, wherein the at least one magnet film is a pair of magnet films that are located on both lateral sides of the free layer, and the free layer has a rectangular shape having short sides that face the pair of magnet films, as seen from a direction in which the free layer, the spacer layer and the pinned layer are stacked.

25. The magnetic sensor according to claim 20, wherein a ratio of a product of saturated magnetization and a film thickness of the at least one magnet film to a product of saturated magnetization and a film thickness of the free layer is two or more and four or less.

26. A magnetic sensor comprising:
a magnetoresistance effect element having a metal thin film whose magnetization direction changes in response to an external magnetic field; and
at least one magnet film that applies a bias magnetic field to the metal thin film,
wherein a film thickness of the at least one magnet film is 15 nm or more and 50 nm or less, and
wherein a relationship of $0.7 \leq T_{HK=0\_HM}/T_{C\_ML} \leq 1.05$ is satisfied, where $T_{HK=0\_HM}$ (K) is a temperature of the at least one magnet film at which an anisotropic magnetic field thereof becomes zero, and $T_{C\_ML}$ (K) is Curie temperature of the metal thin film.

27. The magnetic sensor according to claim 26, wherein the film thickness of the at least one magnet film is 20 nm or more and 50 nm or less.

28. The magnetic sensor according to claim 26, wherein the film thickness of the at least one magnet film is 25 nm or more and 50 nm or less.

29. The magnetic sensor according to claim 26, wherein the at least one magnet film further contains one or more elements selected from the group consisting of Cr, Ta, B, Ni, Ti, W, V, Mo, Mn, Zr, Nb, Hf, Si, Cu, Ag, Al, Ru and Rh.

30. The magnetic sensor according to claim 26, wherein the at least one magnet film is a pair of magnet films that are located on both lateral sides of the free layer, and the free layer has a rectangular shape having short sides that face the pair of magnet films, as seen from a direction in which the free layer, the spacer layer and the pinned layer are stacked.

31. The magnetic sensor according to claim 26, wherein a ratio of a product of saturated magnetization and a film thickness of the at least one magnet film to a product of saturated magnetization and a film thickness of the free layer is two or more and four or less.

32. A magnetic sensor comprising:
a magnetoresistance effect element having a metal thin film whose magnetization direction changes in response to an external magnetic field; and
at least one magnet film that applies a bias magnetic field to the metal thin film,
wherein a film thickness of the at least one magnet film is 15 nm or more and 50 nm or less, and
wherein a relationship of $0.7 \leq T_{HC=0\_HM}/T_{C\_ML} \leq 1.05$ is satisfied, where $T_{HC=0\_HM}$ (K) is a temperature of the at least one magnet film at which a coercive force thereof becomes zero, and $T_{C\_ML}$ (K) is a Curie temperature of the metal thin film.

33. The magnetic sensor according to claim 32, wherein the film thickness of the at least one magnet film is 20 nm or more and 50 nm or less.

34. The magnetic sensor according to claim 32, wherein the film thickness of the at least one magnet film is 25 nm or more and 50 nm or less.

35. The magnetic sensor according to claim 32, wherein the at least one magnet film further contains one or more elements selected from the group consisting of Cr, Ta, B, Ni, Ti, W, V, Mo, Mn, Zr, Nb, Hf, Si, Cu, Ag, Al, Ru and Rh.

36. The magnetic sensor according to claim 32, wherein the at least one magnet film is a pair of magnet films that are located on both lateral sides of the free layer, and the free layer has a rectangular shape having short sides that face the pair of magnet films, as seen from a direction in which the free layer, the spacer layer and the pinned layer are stacked.

37. The magnetic sensor according to claim 32, wherein a ratio of a product of saturated magnetization and a film thickness of the at least one magnet film to a product of saturated magnetization and a film thickness of the free layer is two or more and four or less.

* * * * *